(12) United States Patent
Takahashi et al.

(10) Patent No.: US 7,999,578 B2
(45) Date of Patent: Aug. 16, 2011

(54) WAVEFORM GENERATION DEVICE, WAVEFORM GENERATION METHOD, AND COMPUTER READABLE MEDIUM

(75) Inventors: Takeshi Takahashi, Gunma (JP); Masayuki Tomita, Saitama (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 12/614,761

(22) Filed: Nov. 9, 2009

(65) Prior Publication Data

US 2010/0164555 A1 Jul. 1, 2010

Related U.S. Application Data

(63) Continuation of application No. PCT/JP2008/059377, filed on May 21, 2008.

(30) Foreign Application Priority Data

Jun. 5, 2007 (JP) ................................. 2007-149786

(51) Int. Cl.
*H03B 21/00* (2006.01)

(52) U.S. Cl. .......... 327/105; 327/106; 327/107; 84/602; 84/603; 84/604

(58) Field of Classification Search .......... 327/105–107; 84/602–604
See application file for complete search history.

(56) References Cited

U.S. PATENT DOCUMENTS

| | | | | |
|---|---|---|---|---|
| 5,371,315 A | * | 12/1994 | Hanzawa et al. | 84/603 |
| 5,459,279 A | * | 10/1995 | Okamoto | 84/604 |
| 5,714,704 A | * | 2/1998 | Suzuki et al. | 84/604 |
| 5,942,708 A | * | 8/1999 | Yamamoto | 84/604 |
| 5,981,860 A | * | 11/1999 | Isozaki et al. | 84/603 |
| 6,137,046 A | * | 10/2000 | Kamiya | 84/604 |
| 6,218,604 B1 | * | 4/2001 | Yamamoto | 84/604 |
| 6,326,537 B1 | * | 12/2001 | Tamura | 84/603 |
| 6,535,772 B1 | * | 3/2003 | Miyamori et al. | 700/90 |
| 2006/0273943 A1 | | 12/2006 | Kawabata | |

FOREIGN PATENT DOCUMENTS

| | | |
|---|---|---|
| JP | 1-218201 A | 9/1989 |
| JP | 2-265305 A | 10/1990 |
| JP | 6-160474 A | 6/1994 |
| JP | 7-225630 A | 8/1995 |

(Continued)

OTHER PUBLICATIONS

International Search Report (ISR) for PCT/JP2008/059377 for Examiner consideration, Foreign Patent Document Nos. 1-6 listed above, Aug. 12, 2008.

(Continued)

*Primary Examiner* — Kenneth B. Wells
(74) *Attorney, Agent, or Firm* — Chen Yoshimura LLP

(57) ABSTRACT

Provided is a waveform generating apparatus that generates a signal having an arbitrary waveform, comprising a waveform memory that stores a plurality of pieces of waveform data that each include a sequence of signal values; a filtering section that (i) reads from the waveform memory a piece of waveform data serving as a basis for a waveform to be generated, from among the plurality of pieces of waveform data, (ii) performs a conversion by filtering the read piece of waveform data to obtain a piece of converted waveform data, and (iii) writes to the waveform memory the piece of converted waveform data; and a waveform output section that reads the piece of converted waveform data from the waveform memory and outputs a signal having a waveform corresponding to the sequence of signal values of the read piece of converted waveform data.

9 Claims, 12 Drawing Sheets

FOREIGN PATENT DOCUMENTS

| | | |
|---|---|---|
| JP | 7-273555 A | 10/1995 |
| JP | 8-293734 A | 11/1996 |
| JP | 2000-276149 A | 10/2000 |
| JP | 2006-337140 A | 12/2006 |

OTHER PUBLICATIONS

Written Opinion (PCT/ISA/237) of PCT/JP2008/059377, Aug. 12, 2008.

* cited by examiner

WAVEFORM GENERATION DEVICE, WAVEFORM GENERATION METHOD, AND COMPUTER READABLE MEDIUM

CROSS REFERENCE TO RELATED APPLICATION

This is a continuation application of PCT/JP2008/059377 filed on May 21, 2008 which claims priority from a Japanese Patent Application No. 2007-149786 filed on Jun. 5, 2007, the contents of which are incorporated herein by reference.

BACKGROUND

1. Technical Field

The present invention relates to a waveform generating apparatus, a waveform generating method, and a program. In particular, the present invention relates to a waveform generating apparatus, a waveform generating method, and a program for generating a signal with an arbitrary waveform.

2. Related Art

A waveform generating apparatus that can generate a signal with an arbitrary waveform is known, as in, for example, Japanese Patent Application Publication No. 2006-337140 and Japanese Patent Application Publication No. 7-273555. Such a waveform generating apparatus includes a waveform memory that stores waveform data, which is a data sequence of signal values of the waveform to be generated, and a DA converting section that reads the waveform data, converts this data into an analog signal, and outputs the analog signal. This waveform generating apparatus can cause the waveform memory to store waveform data of an arbitrary waveform created by a user, and can output this waveform data.

There may be cases in which the waveform generating apparatus outputs waveform data that is obtained by filtering the waveform data created by the user. For example, the waveform generating apparatus may output (i) waveform data obtained by performing a period conversion, i.e. rate conversion, on the waveform data created by the user and (ii) waveform data obtained by adding a prescribed transfer characteristic to the waveform data created by the user. In these cases, however, an external computer must read the waveform data from the waveform memory of the waveform generating apparatus to perform the filtering operation, and must write the result of the filtering operation to the waveform memory in advance.

SUMMARY

Therefore, it is an object of an aspect of the innovations herein to provide a waveform generating apparatus, a waveform generating method, and a program, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary waveform generating apparatus may include a waveform generating apparatus that generates a signal having an arbitrary waveform, comprising a waveform memory that stores a plurality of pieces of waveform data that each include a sequence of signal values; a filtering section that (i) reads from the waveform memory a piece of waveform data serving as a basis for a waveform to be generated, from among the plurality of pieces of waveform data, (ii) performs a conversion by filtering the read piece of waveform data to obtain a piece of converted waveform data, and (iii) writes to the waveform memory the piece of converted waveform data; and a waveform output section that reads the piece of converted waveform data from the waveform memory and outputs a signal having a waveform corresponding to the sequence of signal values of the read piece of converted waveform data.

According to a second aspect related to the innovations herein, one exemplary waveform generating method may include a waveform generating method for generating a signal having an arbitrary waveform, comprising storing in a waveform memory a plurality of pieces of waveform data that each include a sequence of signal values; (i) reading from the waveform memory a piece of waveform data serving as a basis for a waveform to be generated, from among the plurality of pieces of waveform data, (ii) performing a conversion by filtering the read piece of waveform data to obtain a piece of converted waveform data, and (iii) writing to the waveform memory the piece of converted waveform data; and reading the piece of converted waveform data from the waveform memory and outputting a signal having a waveform corresponding to the sequence of signal values of the read piece of converted waveform data.

According to a third aspect related to the innovations herein, one exemplary program may include a program causing an information processing apparatus to function as a waveform generating apparatus that generates a signal having an arbitrary waveform, the program causing the information processing apparatus to function as a waveform memory that stores a plurality of pieces of waveform data that each include a sequence of signal values; a filtering section that (i) reads from the waveform memory a piece of waveform data serving as a basis for a waveform to be generated, from among the plurality of pieces of waveform data, (ii) performs a conversion by filtering the read piece of waveform data to obtain a piece of converted waveform data, and (iii) writing to the waveform memory the piece of converted waveform data; and a waveform output section that reads the piece of converted waveform data from the waveform memory and outputs a signal having a waveform corresponding to a sequence of signal values of the read piece of converted waveform data.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
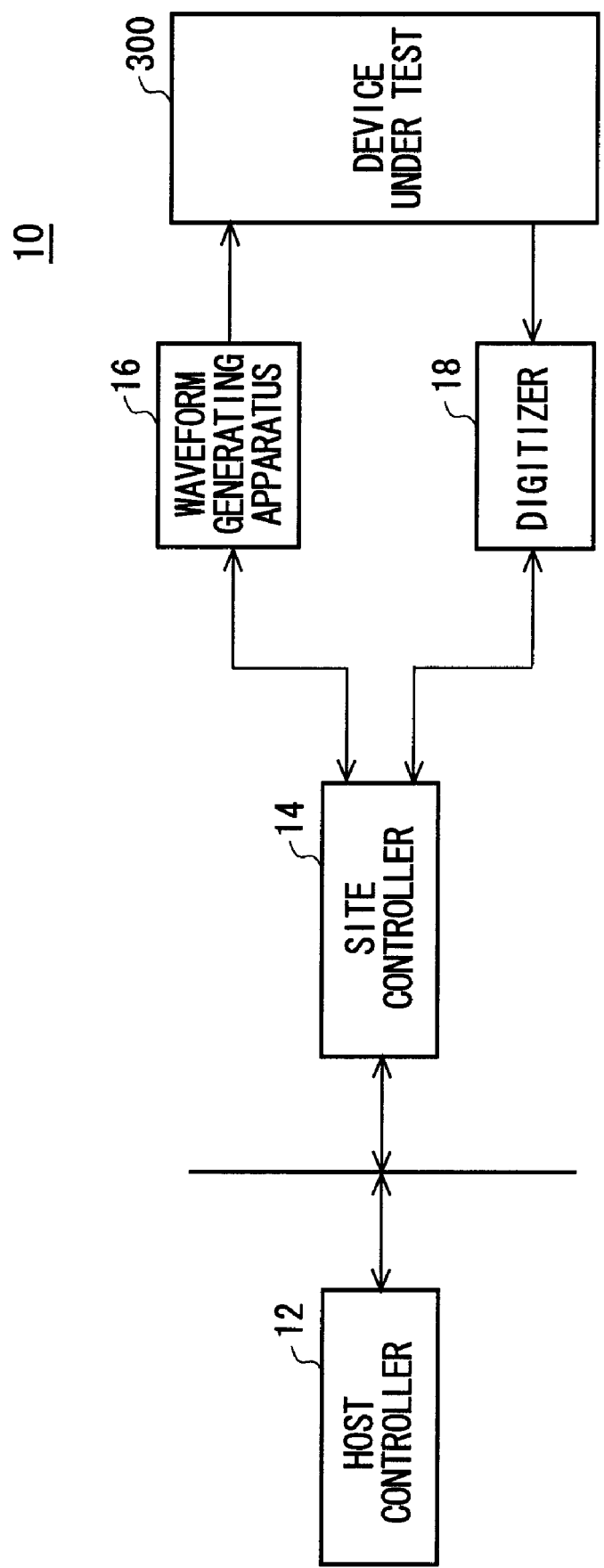
FIG. 1 shows a configuration of a test apparatus 10 according to an embodiment of the present invention, along with a device under test 300.

FIG. 1 shows a configuration of a test apparatus 10 according to an embodiment of the present invention, along with a device under test 300. The test apparatus 10 tests the device under test 300, to which an analog signal can be input and from which an analog signal can be output. More specifically, the test apparatus 10 supplies the device under test 300 with an analog test signal, and acquires an analog output signal that is output by the device under test 300 in response to a test signal. The test apparatus 10 judges acceptability of the device under test 300 by comparing the waveform of the acquired output signal to an expected waveform.

The test apparatus 10 includes a host controller 12, a site controller 14, a waveform generating apparatus 16, and a digitizer 18. The host controller 12 controls the test apparatus 10. The site controller 14 controls the waveform generating apparatus 16 and the digitizer 18. The site controller 14 acquires a test program from the host controller 12, for example, via a bus. The site controller 14 controls the waveform generating apparatus 16 and the digitizer 18 by executing the acquired test program.

The waveform generating apparatus 16 generates a signal having a given waveform under the control of the site controller 14, and outputs the generated signal to the device under test 300 as the test signal. The digitizer 18 acquires the waveform of the output signal from the device under test 300 under the control of the site controller 14. The site controller 14 judges acceptability of the device under test 300 based on the waveform acquired by the digitizer 18.

Figure 2:
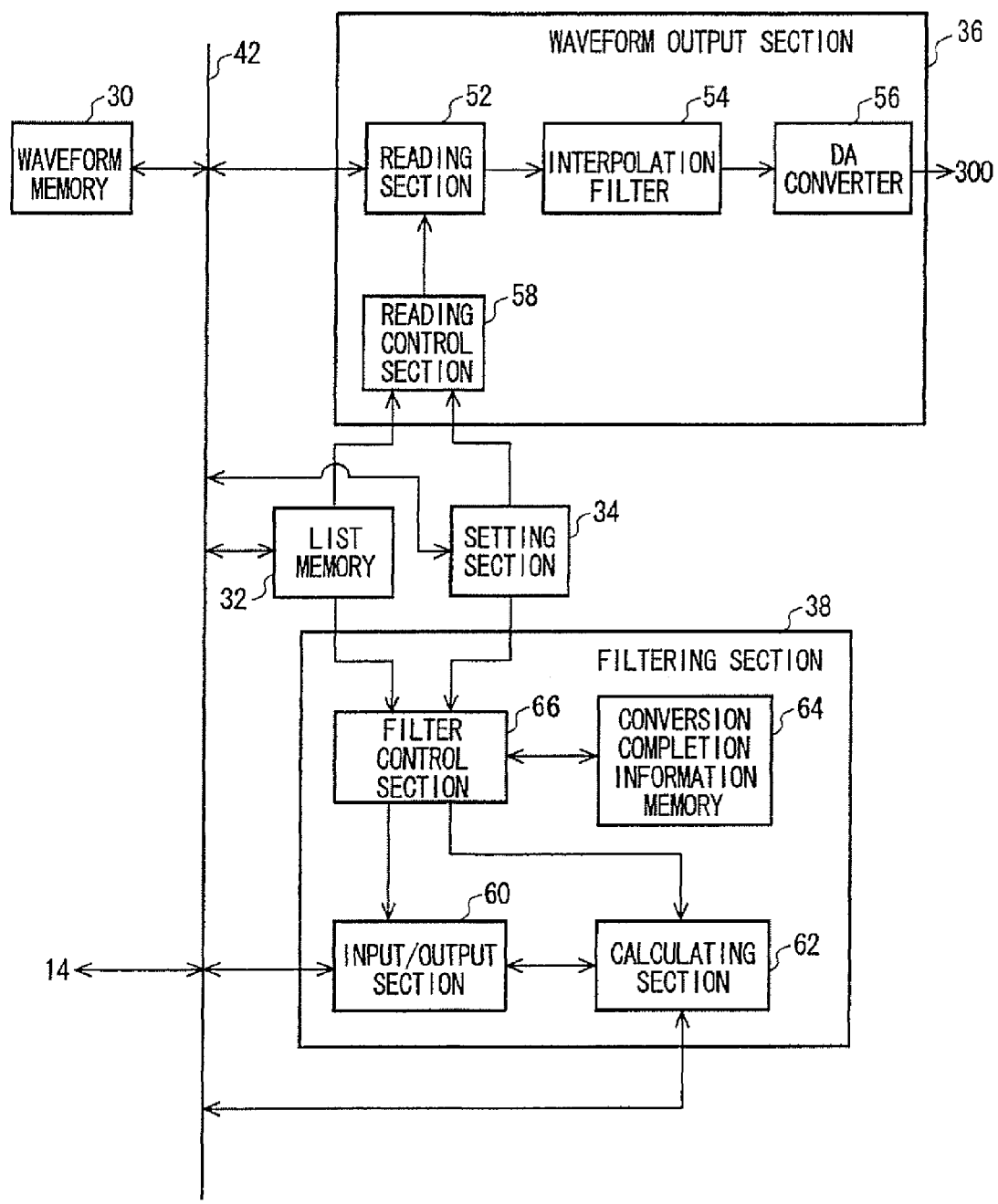
FIG. 2 shows a configuration of the waveform generating apparatus 16 according to the present embodiment.
Figure 3:
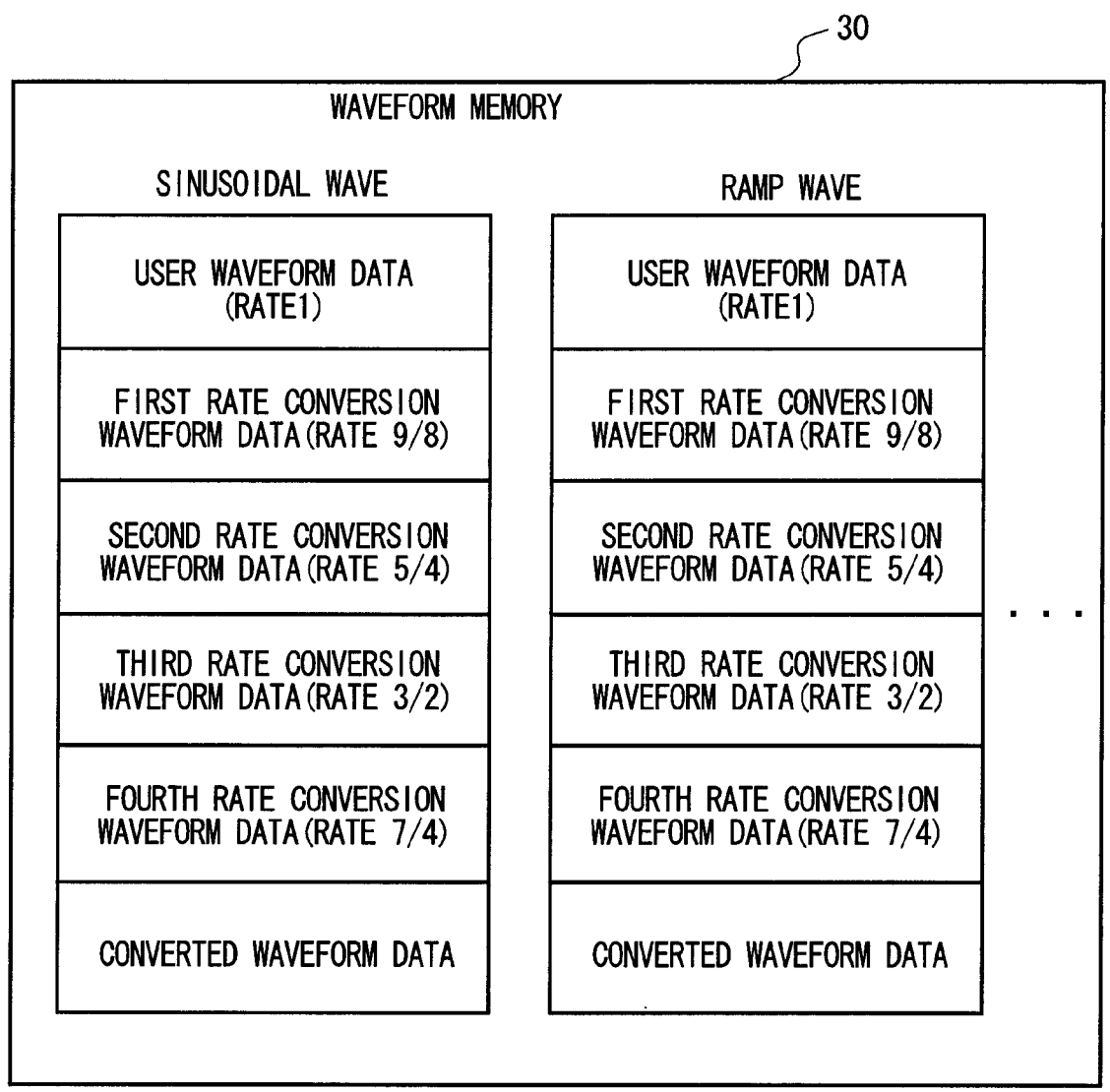
FIG. 3 shows exemplary waveform data stored in the waveform memory 30.

FIG. 2 shows a configuration of the waveform generating apparatus 16 according to the present embodiment. FIG. 3 shows exemplary waveform data stored in the waveform memory 30.

The waveform generating apparatus 16 includes a waveform memory 30, a list memory 32, a setting section 34, a waveform output section 36, and a filtering section 38. In the waveform generating apparatus 16, the waveform memory 30, the list memory 32, the setting section 34, the waveform output section 36, and the filtering section 38 may be connected to each other via a bus 42, for example, and can be accessed by the site controller 14 via the bus 42.

The waveform memory 30 stores a plurality of pieces of waveform data that each include a data sequence of signal values. Each piece of waveform data may be a sequence of signal values obtained by sampling one period of a given waveform at constant intervals.

As shown in FIG. 3, the waveform memory 30 stores, as the waveform data, user waveform data that represents a type of waveform designated by the user. For example, the waveform memory 30 may store user waveform data that represents a sinusoidal wave, a ramp wave, or any other type of waveform generated by the user. The site controller 14 may generate the user waveform data prior to the waveform generation by the waveform generating apparatus 16, and may write the user waveform data to the waveform memory 30.

Furthermore, as shown in FIG. 3, the waveform memory 30 may store, as the waveform data, at least one piece of rate conversion waveform data corresponding to each piece of user waveform data. The rate conversion waveform data is obtained by performing a rate conversion on the corresponding user waveform data. In other words, if the user waveform data represents a waveform with a rate of 1, the rate conversion waveform data represents a waveform with a rate that is not 1.

For example, the waveform memory 30 may store rate conversion waveform data that represents waveforms with rates that are 9/8, 5/4, 3/2, 7/4, etc. times the rate of the waveform represented by the corresponding user waveform data. Prior to the waveform generation by the waveform generating apparatus 16, the site controller 14 may generate the rate conversion waveform data using rates designated by the user and write the generated rate conversion waveform data to the waveform memory 30.

In addition to the user waveform data and the one or more pieces of rate conversion waveform data, the waveform memory 30 can store converted waveform data corresponding to each piece of user waveform data, as shown in FIG. 3. Each piece of converted waveform data is obtained by filtering one of the corresponding pieces of waveform data, i.e. the corresponding user waveform data or one of the pieces of corresponding rate conversion waveform data. For example, each piece of converted waveform data may be obtained by filtering the waveform data corresponding to a rate set by the setting section 34 from among the corresponding waveform data, i.e. the corresponding user waveform data or corresponding rate conversion waveform data. Each piece of converted waveform data may be obtained by filtering the corresponding user waveform data or the corresponding rate conversion waveform data using a filter coefficient that corresponds to a frequency characteristic of the transmission path of the test signal from the waveform generating apparatus 16 to the device under test 300.

The list memory 32 stores a list that designates an order of generation for two or more waveforms output by the waveform generating apparatus 16. The site controller 14 may generate the list prior to waveform generation, and write the list to the list memory 32.

The setting section 34 sets the rate of the waveform output by the waveform generating apparatus 16. For example, the setting section 34 may set a rate of 1, 9/8, 5/4, 3/2, 7/4, or the like.

The setting section 34 sets whether a filtered waveform is generated. In other words, the setting section 34 sets whether the waveform generating apparatus 16 outputs a waveform corresponding to the converted waveform data instead of the user waveform data or the rate conversion waveform data. Prior to the waveform generation, the site controller 14 may write, to the setting section 34, a setting value for the rate and a setting value for determining whether the filtered waveform is generated.

The waveform output section 36 reads the waveform data from the waveform memory 30 according to the list stored in the list memory 32 and the settings from the setting section 34, and outputs to the device under test 300 an analog signal having a waveform corresponding to the sequence of signal values of the read waveform data. More specifically, on a condition that the setting indicates that a filtered waveform is not generated, the waveform output section 36 reads the user waveform data or the rate conversion waveform data corresponding to the waveform designated by the list from the waveform memory 30 in an order designated by the list, and outputs a signal that corresponds to the read waveform data. In this case, the waveform output section 36 reads the user waveform data or the rate conversion waveform data corresponding to the set rate. The waveform output section 36 reads the user waveform data if a rate of 1 is set, and reads the rate conversion waveform data corresponding to the set rate if a rate other than 1 is set.

On a condition that the setting indicates generation of a filtered waveform, the waveform output section 36 reads the converted waveform data corresponding to the waveform designated by the list in the order designated by the list, and outputs a signal corresponding to the read converted waveform data. When the setting indicates generation of the filtered waveform, the waveform memory 30 stores in advance the converted waveform data obtained by filtering the waveform data having the set rate, i.e. the user waveform data or the rate conversion waveform data.

In the present embodiment, the waveform output section 36 includes a reading section 52, an interpolation filter 54, a DA converter 56, and a reading control section 58. The reading section 52 sequentially reads from the waveform memory 30 the sequence of signal values included in the waveform data designated by the reading control section 58. The interpolation filter 54 interpolates a sequence of signal values corresponding to the sampling frequency of the DA converter 56, based on the signal values sequentially read by the reading section 52. The DA converter 56 DA converts the sequence of signal values interpolated by the interpolation filter 54. The DA converter 56 outputs the analog signal obtained from the DA conversion to the device under test 300 as the test signal.

The reading control section 58 designates the waveform data to be read from the waveform memory 30 by the reading section 52, based on the list stored in the list memory 32 and the settings of the setting section 34. For example, when the designation indicates output of the waveform designated by a portion of the list, the reading control section 58 causes the reading section 52 to read, in the order designated by this portion of the list, the waveform data corresponding to the waveform designated by this portion of the list.

On a condition that generation of the filtered waveform is set by the setting section 34, the filtering section 38 may read from the waveform memory 30 the waveform data serving as the basis for the waveform to be output, from among the plurality of pieces of waveform data stores in the waveform memory 30, and perform the conversion by filtering the read waveform data to obtain the converted waveform data. As another example, on a condition that generation of the filtered waveform is set, the filtering section 38 may read from the waveform memory 30 the waveform data, i.e. the user waveform data or the rate conversion waveform data, corresponding to the rate set by the setting section 34, and perform the conversion by filtering the read waveform data to obtain the converted waveform data. If a rate of 1 is set, the filtering section 38 performs the conversion by filtering the user waveform data to obtain the converted waveform data. If a rate other than 1 is set, the filtering section 38 performs the conversion by filtering the rate conversion waveform data corresponding to the set rate to obtain the converted waveform data.

As another example, upon receiving instructions for waveform generation from the site controller 14 or the like, the filtering section 38 may read from the waveform memory 30 the waveform data serving as the basis for the waveform designated by the list, convert the read waveform data into the converted waveform data, and write the converted waveform data to the waveform memory 30. In this way, when generation of the filtered waveform is set, the filtering section 38 can cause the waveform output section 36 to output a signal having a waveform corresponding to the converted waveform data.

In this case, the filtering section 38 selects the waveform data having the set rate and converts the selected waveform data into the converted waveform data. In this way, the filtering section 38 can cause the waveform output section 36 to output a signal having a waveform that corresponds to the converted waveform data obtained by filtering the waveform data corresponding to the set rate.

When output of a waveform in a certain portion of the list is designated, the filtering section 38 may convert the waveform data corresponding to the waveform designated in this portion of the list into the converted waveform data, and write this converted waveform data to the waveform memory 30. In this way, the filtering section 38 can cause the waveform output section 36 to output a signal having a waveform that corresponds to the converted waveform data corresponding to the waveform designated in a certain portion of the list.

The filtering section 38 may include an input/output section 60, a calculating section 62, a conversion completion information memory 64, and a filter control section 66. The input/output section 60 controls input and output of data between the waveform memory 30 and the calculating section 62. More specifically, the input/output section 60 reads from the waveform memory 30 the waveform data, i.e. the user waveform data or the rate conversion waveform data, corresponding to the set rate, and transmits the read waveform data to the calculating section 62. Furthermore, the input/output section 60 writes the converted waveform data converted by the calculating section 62 to the waveform memory 30.

The calculating section 62 filters the waveform data read by the input/output section 60. The calculating section 62 may be a DSP and a CPU or the like that performs FIR filtering, IIR filtering, or the like.

For example, the calculating section 62 may receive a filter coefficient from the site controller 14 or the like and perform the filtering according to the received filter coefficient. The site controller 14 or the like may supply the calculating section 62 with a filter coefficient that represents the inverse of a frequency characteristic of the transmission path from the waveform generating apparatus 16 to the device under test 300 on which the test signal is transmitted. In this way, the filtering section 38 can generate converted waveform data representing a waveform in which distortion caused by the transmission path is corrected in advance.

The conversion completion information memory 64 stores conversion completion information indicating whether the corresponding converted waveform data has been created, for each piece of waveform data that can serve as a basis for the waveforms to be generated that are stored in the waveform memory 30. For example, for each piece of user waveform data, the conversion completion information memory 64 may store conversion completion information indicating whether the corresponding converted waveform data is stored in the waveform memory 30.

On a condition that generation of the filtered waveform is set by the setting section 34, the filter control section 66 causes the input/output section 60 and the calculating section 62 to perform the conversion process. If the list designates that one waveform is to be generated multiple times, the filter control section 66 may stop the conversion if the converted waveform data corresponding to this one waveform is already stored in the waveform memory 30. If the conversion completion information stored in the conversion completion information memory 64 indicates that conversion of the waveform data serving as the basis of the waveform to be generated has been completed, the filter control section 66 may stop the conversion of this waveform data. In this way, the filter control section 66 can avoid performing redundant filtering processes.

If the filtering process performed by the filtering section 38 changes due to a new filter coefficient being provided, the filter control section 66 may clear the converted waveform data stored in the waveform memory 30. In addition, when the filtering process performed by the filtering section 38 changes, the filter control section 66 may clear the conversion completion information stored in the conversion completion information memory 64. In this way, when the filter coefficient is changed, the filter control section 66 can prevent mistaken output of waveform data that was filtered using the previous filter coefficient, and can thereby reliably generate waveform data that is filtered using the updated filter coefficient.

The waveform generating apparatus 16 having the configuration described above can output, instead of a signal corresponding to waveform data generated by the user, a signal corresponding to waveform data obtained by filtering the waveform data generated by the user. For example, the waveform generating apparatus 16 can output a signal corresponding to waveform data representing a waveform that has passed through the transmission path. Furthermore, since an internal filtering section 38 filters the waveform data, the waveform generating apparatus 16 can generate the filtered waveform data without using an external computer or the like.

Figure 4:
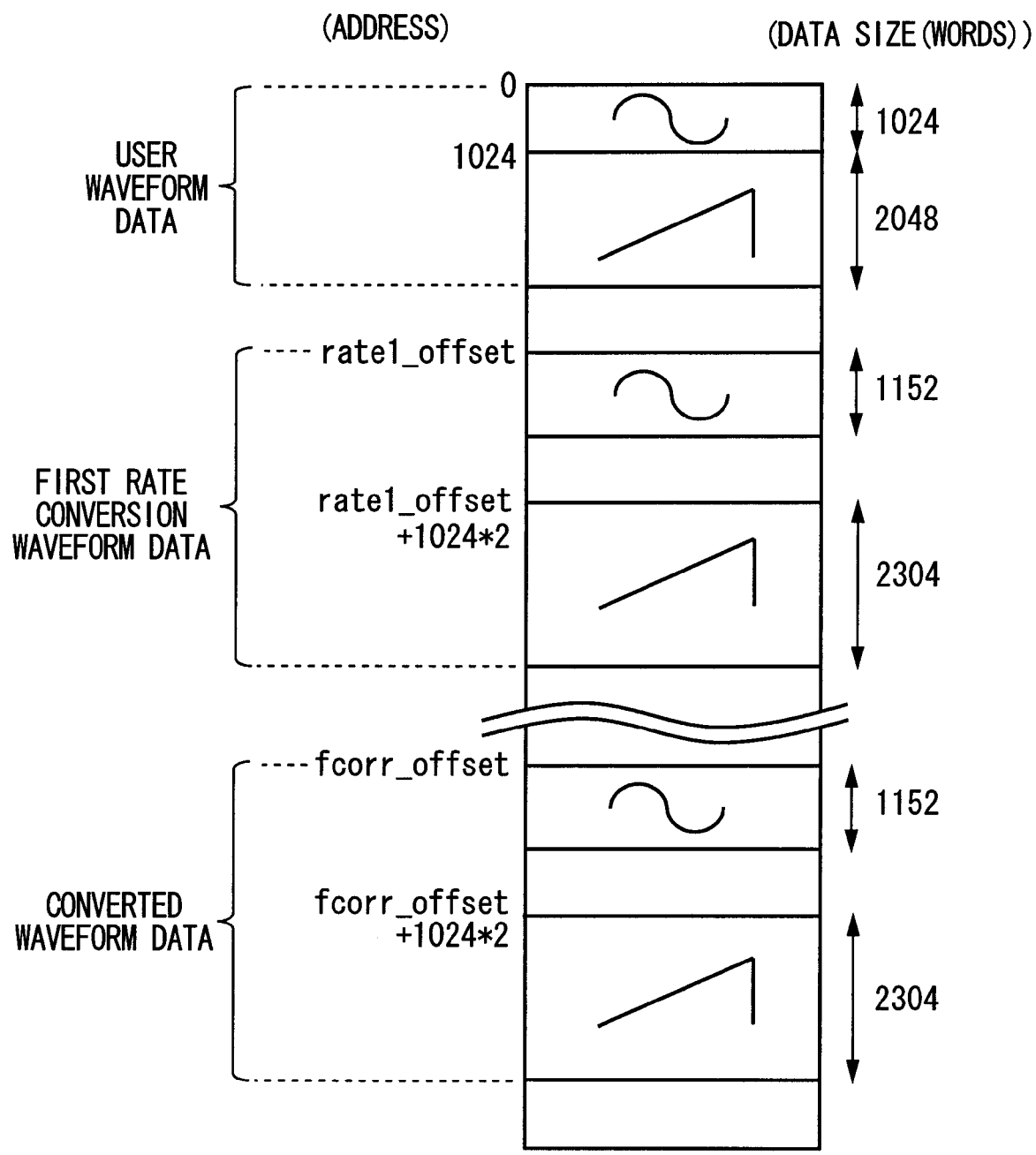
FIG. 4 shows an exemplary address region of waveform data stored in the waveform memory 30.

FIG. 4 shows exemplary address regions of waveform data stored in the waveform memory 30. In the present embodiment, the waveform memory 30 stores in predetermined regions (i) one or more pieces of user waveform data, (ii) one or more pieces of rate conversion waveform data corresponding to each piece of user waveform data, and (iii) a piece of converted waveform data corresponding to each piece of user waveform data.

In the present embodiment, the waveform memory 30 stores each piece of user waveform data in a predetermined region identified by a start address and data size. The waveform memory 30 stores each piece of rate conversion waveform data and converted waveform data in a predetermined region whose leading address is obtained by adding a prescribed offset value to the start address of the corresponding user waveform data.

Figure 5:
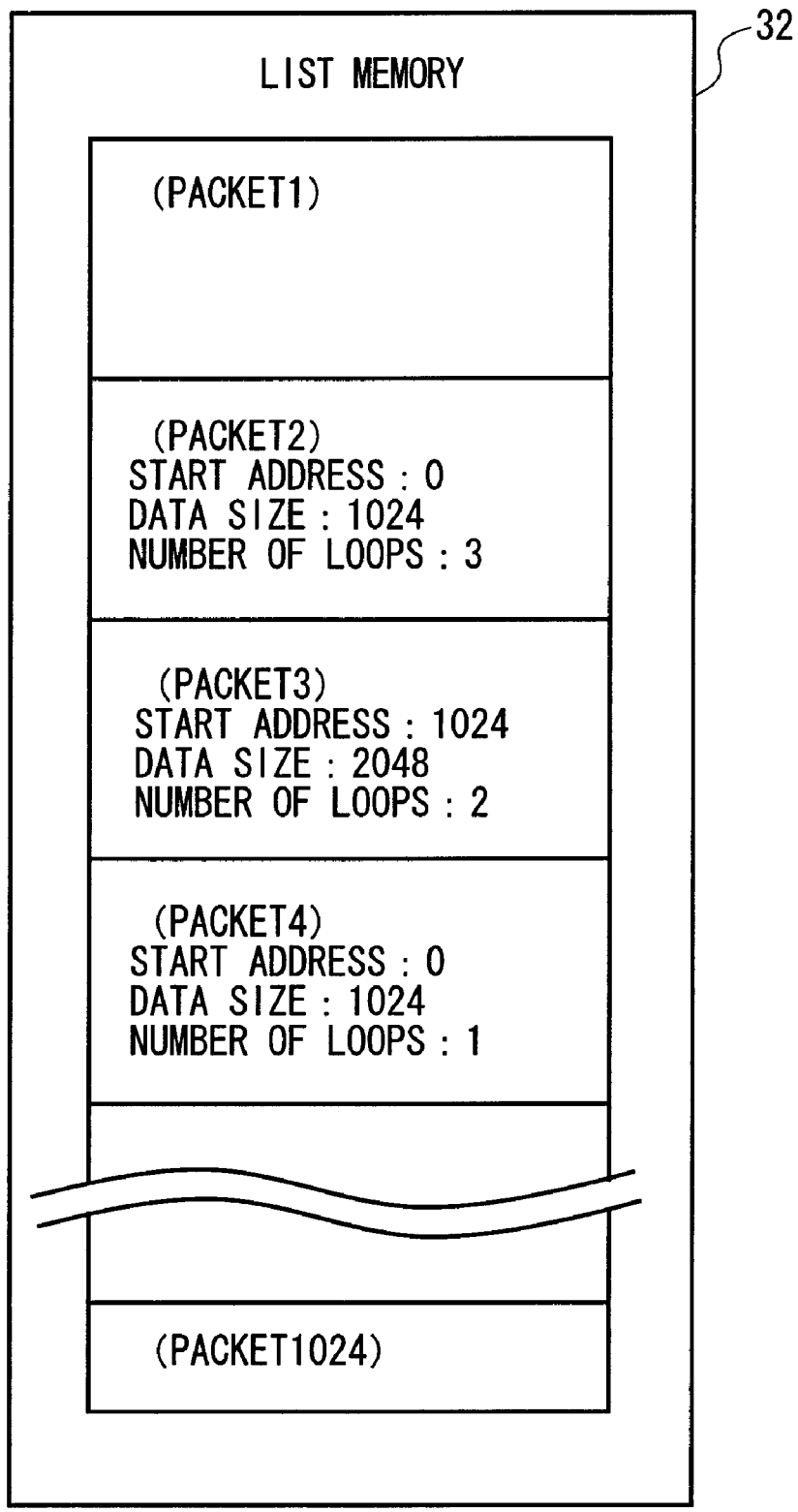
FIG. 5 shows an exemplary list stored in the list memory 32.

FIG. 5 shows an exemplary list stored in the list memory 32. The list stored in the list memory 32 may be a packet sequence including one or more packets designating waveforms to be generated. In each packet, a packet number, a start address, a data size, and a number of loops are recorded.

The packet number indicates the position of the packet within the packet sequence. The waveform output section 36 generates the waveforms designated by the packets in series in an order according to the packet numbers.

The start address represents the leading address of the region in which is stored the user waveform data corresponding to the waveform to be generated. The data size represents the size of the region in which is stored the user waveform data corresponding to the waveform to be generated. For each packet, the waveform output section 36 reads the sequence of signal values of the waveform data from the region identified by the start address and the data size recorded in the packet, and generates a signal having the waveform designated by the packet.

The number of loops represents the number of times the same waveform in generated for a single packet. The waveform output section 36 reads the designated waveform data in series for the designated number of loops, and generates a signal having the same waveform in series for the designated number of loops.

Figure 6:
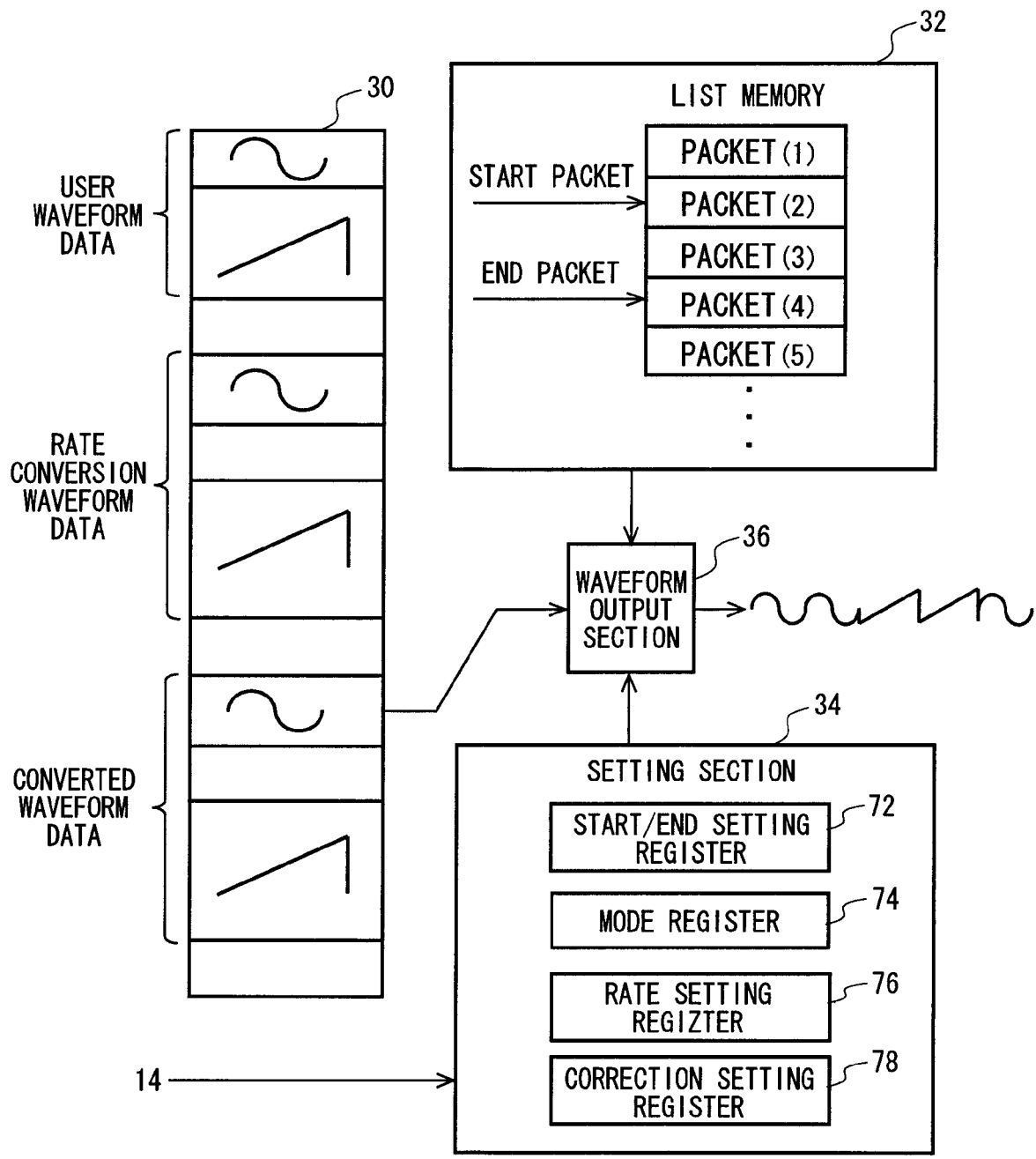
FIG. 6 shows an exemplary configuration of the setting section 34 according to the present embodiment, along with the waveform memory 30, the list memory 32, and the waveform output section 36.

FIG. 6 shows an exemplary configuration of the setting section 34 according to the present embodiment, along with the waveform memory 30, the list memory 32, and the waveform output section 36. The setting section 34 may include a start/end setting register 72, a mode register 74, a rate setting register 76, and a correction setting register 78.

The start/end setting register 72 stores start packets indicating packets at which output of the waveform is begun and end packets indicating packets at which output of the waveform is ended, and these packets are used when a waveform designated by a certain portion of the list is output. For example, prior to the waveform generation by the waveform generating apparatus 16, the site controller 14 may write to the start/end setting register 72 a value indicating a start packet and an end packet.

The mode register 74 stores setting values that indicate operational modes. More specifically, the mode register 74 stores setting values indicating a normal mode or a one-shot mode. Prior to generation of the waveform, the site controller 14 may write to the correction setting register 78 the setting values indicating the normal mode or the one-shot mode.

If a setting value indicating the normal mode is stored in the mode register 74, the waveform output section 36 cyclically generates the waveforms designated by the packets from the start packet to the end packet according to the packet numbers. In this case, the waveform output section 36 begins generating the waveform on a condition that an initiation instruction is received from the site controller 14, and stops the waveform generation on a condition that a stop instruction is received from the site controller 14.

If a setting value indicating the one-shot mode is stored in the mode register 74, the waveform output section 36 generates one cycle of the waveforms designated by the packets from the start packet to the end packet according to the packet numbers. In this case, the waveform output section 36 begins generating the waveform on a condition that an initiation instruction is received from the site controller 14, and stops the waveform generation on a condition that the end packet is reached.

The waveform output section 36 outputs in series the waveforms designated by the packets. In other words, the waveform output section 36 generates the waveform by removing the intervals from between the packets. Furthermore, for each packet, the waveform output section 36 generates the designated waveform in series for the designated number of loops.

The rate setting register 76 stores values designating the rate of the output waveform. For example, the rate setting register 76 stores values designating rates of 1, 9/8, 5/4, 3/2, 7/4, and the like. Prior to the waveform generation, the site controller 14 may write to the rate setting register 76 the values designating the rate.

The correction setting register 78 stores setting values that indicate whether a filtered waveform is generated. Prior to waveform generation, the site controller 14 may write to the correction setting register 78 the setting values indicating whether the filtered waveform is generated.

If a rate of 1 is set in the rate setting register 76 and a value indicating that the filtered waveform is not generated is set in the correction setting register 78, the waveform output section 36 reads from the waveform memory 30 the user waveform data corresponding to the waveform designated by each packet. The waveform output section 36 then generates the waveform corresponding to the read user waveform data. In this case, for each packet, the waveform output section 36 may read the user waveform data from the region identified by the start address and the data size recorded in the packet.

If a rate other than 1 is set in the rate setting register 76 and a value indicating that the filtered waveform is not generated is set in the correction setting register 78, the waveform output section 36 reads from the waveform memory 30 the rate conversion waveform data corresponding to the rate set for the waveform designated by each packet. The waveform output section 36 then generates the waveform corresponding to the read rate conversion waveform data. In this case, for each packet, the waveform output section 36 may read the waveform data from the region identified by the (i) the address obtained by adding the prescribed offset value to the start address recorded in the packet and (ii) the data size obtained as the product of the set rate and the data size recorded in the packet.

If a value indicating generation of the filtered waveform is set in the correction setting register 78, the waveform output section 36 reads from the waveform memory 30 the converted waveform data corresponding to the waveform designated by each packet. The waveform output section 36 then generates the waveform corresponding to the read converted waveform data. In this case, for each packet, the waveform output section 36 may read the waveform data from the region identified by (i) the address obtained by adding the prescribed offset value to the start address recorded in the packet and (ii) the data size obtained as the product of the prescribed coefficient and the data size recorded in the packet.

Figure 7:
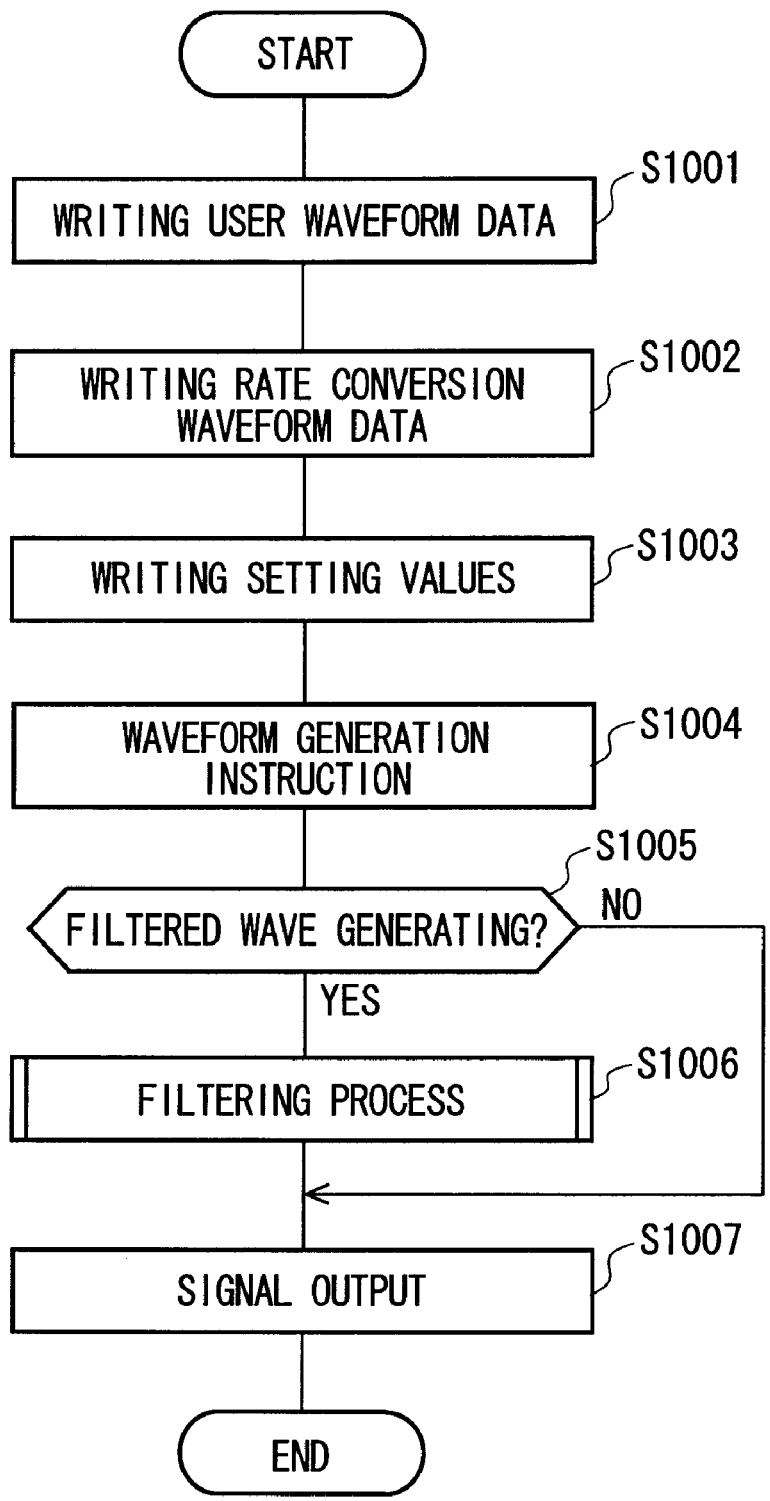
FIG. 7 shows a process flow performed by the waveform generating apparatus 16 during waveform generation.

FIG. 7 shows a process flow performed by the waveform generating apparatus 16 during waveform generation. First, the site controller 14 writes to the waveform memory 30 one or more pieces of user waveform data representing waveforms designated by the user (S1001).

Next, the site controller 14 generates one or more pieces of rate conversion waveform data for each piece of user waveform data written to the waveform memory 30, and writes the rate conversion waveform data to the waveform memory 30 (S1002). The site controller 14 then writes to the setting section 34 each type of setting value (S1003). Next, the site controller 14 supplies the waveform generating apparatus 16 with a waveform generation instruction (S1004).

When the waveform generation instruction is supplied, the filtering section 38 references the setting values of the setting section 34 to judge whether generation of the filtered waveform is set (S1005). If the setting indicates generation of the filtered waveform (the "Yes" of S1005), the filtering section 38 performs the filtering process (S1006). If the setting indicates that the filtered waveform is not generated (the "No" of S1005) or if the filtering process (S1006) has ended, the waveform output section 36 outputs a signal having a waveform according to the list and the setting values (S1007).

Figure 8:
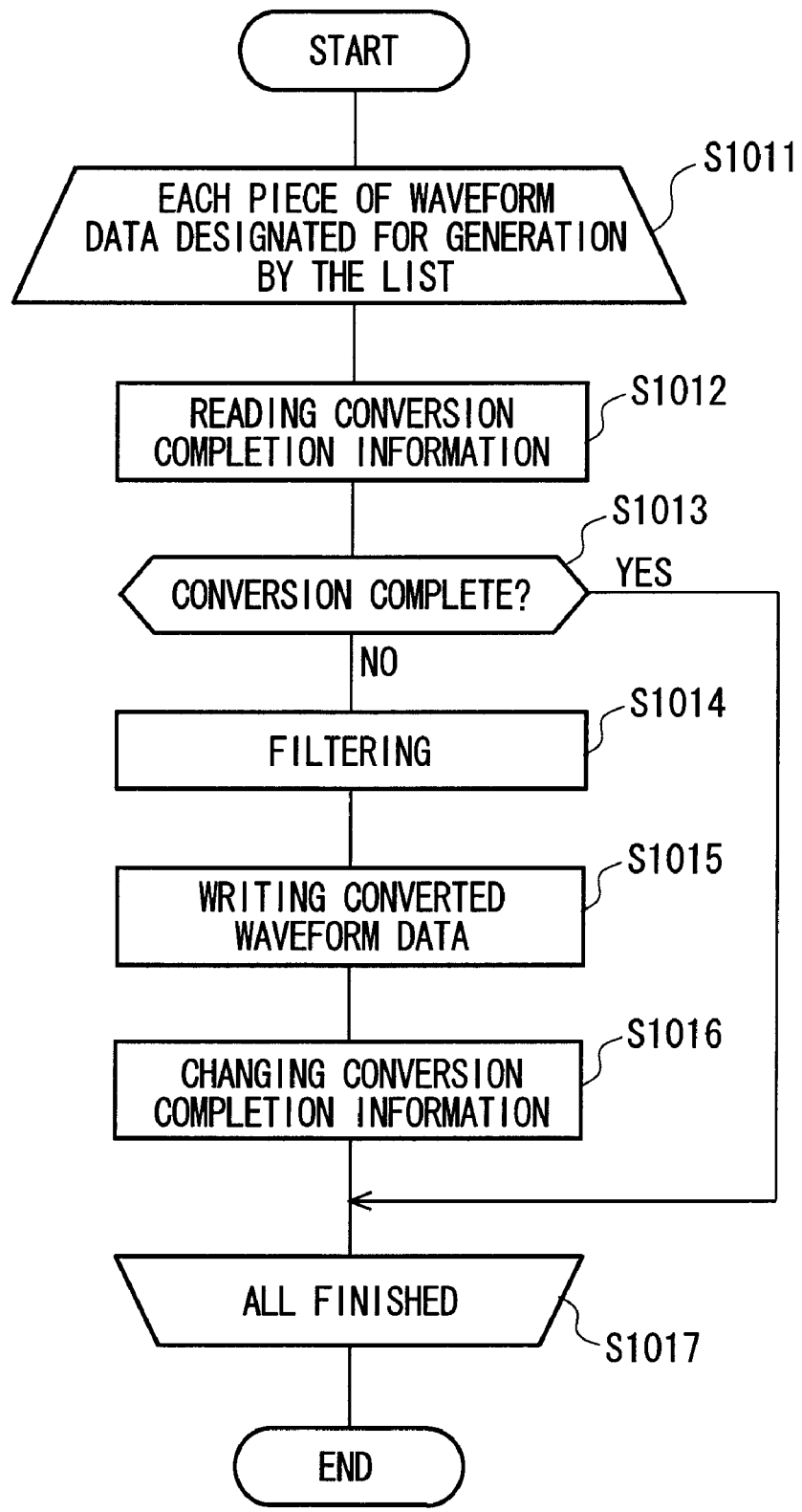
FIG. 8 shows a flow of the filtering process performed at S1006 of FIG. 7.

FIG. 8 shows a flow of the filtering process performed at S1006 of FIG. 7. The filtering section 38 sequentially selects pieces of waveform data serving as the bases for the waveforms designated for generation by the list (S1011, S1017). The filtering section 38 performs the processes from S1012 to S1016 for each selected waveform.

Upon selecting one piece of waveform data, the filtering section 38 reads from the conversion completion information memory 64 the conversion completion information for the corresponding waveform data (S1012). Next, the filtering section 38 determines whether the conversion completion information indicates that conversion of the corresponding waveform data has been completed (S1013). In other words, the filtering section 38 determines whether converted waveform data is already stored in the waveform memory 30.

If it is determined that conversion has been completed, that is, if the corresponding converted waveform data is already stored in the waveform memory 30 (the "Yes" of S1013), the filtering section 38 proceeds to step S1017. In this way, the filtering section 38 can avoid performing redundant conversion processes. If it is determined that the conversion is not completed, that is, if the corresponding converted waveform data is not yet stored in the waveform memory 30 (the "No" of S1013), the filtering section 38 reads from the waveform memory 30 the corresponding waveform data and performs filtering to generate the converted waveform data (S1014).

The filtering section 38 writes to the waveform memory 30 the converted waveform data (S1015). Next, the conversion completion information for the corresponding waveform stored in the conversion completion information memory 64 is changed from a state indicating that conversion has not yet been completed to a state indicating that conversion is completed (S1016). When step S1016 ends, the filtering section 38 moves to the process of step S1017. When the filtering section 38 has completed processing of all of the pieces of waveform data serving as the bases for the waveforms designated by the list (S1017), the filtering process is finished.

Figure 9:
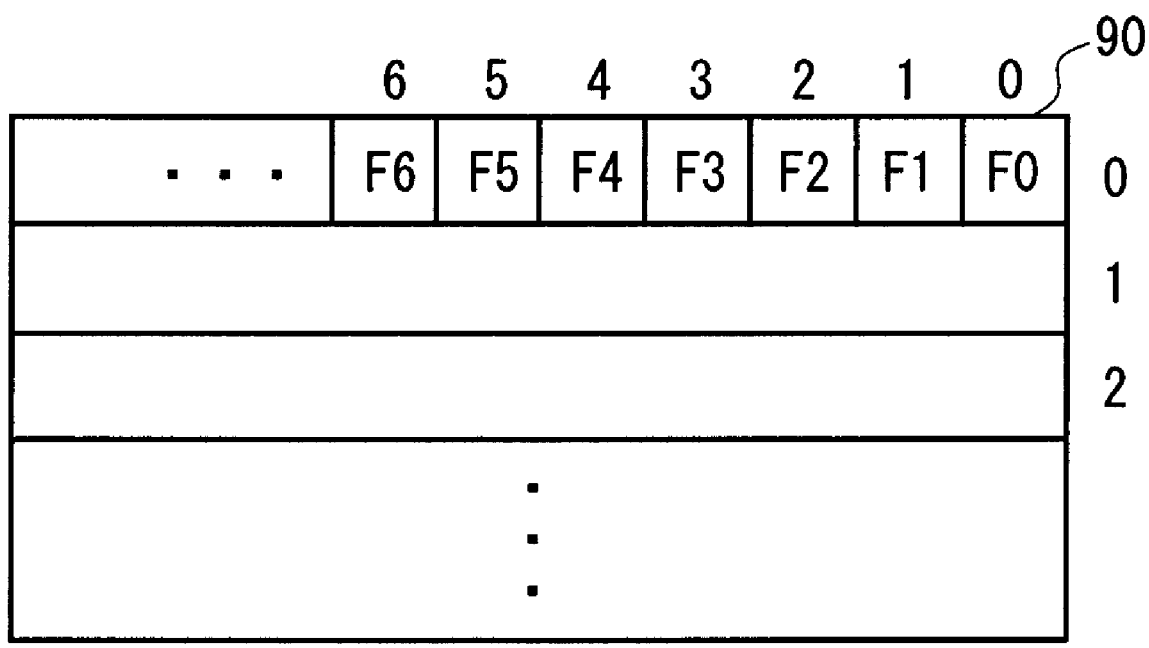
FIG. 9 shows an example of conversion completion information stored in the conversion completion information memory 64 according to the present embodiment.

FIG. 9 shows an example of conversion completion information stored in the conversion completion information memory 64 according to the present embodiment. The conversion completion information memory 64 may include flag storage regions 90-1, 90-2, etc. corresponding respectively to the pieces of waveform data stored in the waveform memory 30. Each flag storage region 90 stores a flag indicating whether creation of the converted waveform data is completed for the corresponding waveform data.

During the filtering process, the filtering section 38 reads from the corresponding flag storage region 90 the flag for each piece of waveform data designated for generation by the list, and determines whether conversion of the corresponding waveform data is completed. In this way, the filtering section 38 of the present embodiment can easily determine whether the conversion is completed.

Figure 10:
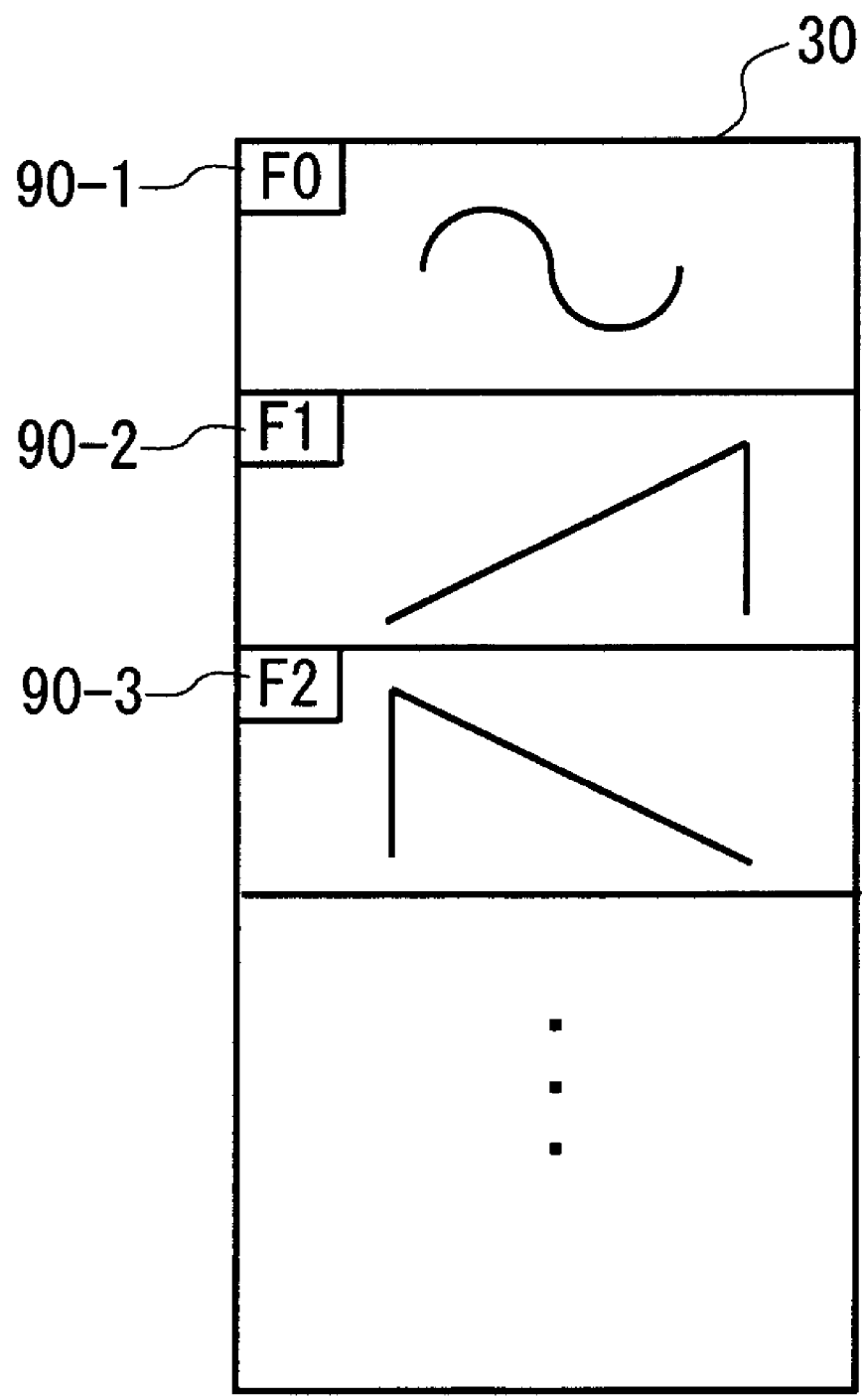
FIG. 10 an exemplary case in which the conversion completion information is stored in the waveform memory 30 instead of the conversion completion information memory 64.

FIG. 10 shows an exemplary case in which the conversion completion information is stored in the waveform memory 30 instead of the conversion completion information memory 64. The waveform memory 30 may include flag storage regions 90-1, 90-2, etc. respectively in a portion, such as a leading bit, of the storage region for each piece of waveform data. Each flag storage region 90 stores a flag indicating whether creation of the converted waveform data is completed for the corresponding waveform data.

During the filtering process, the filtering section 38 reads from the corresponding flag storage region 90 the flag for each piece of waveform data designated for generation by the list, and determines whether conversion of the corresponding waveform data is completed. In this way, the filtering section 38 of the present example need not include the conversion completion information memory 64, and can therefore have a smaller structure.

Figure 11:
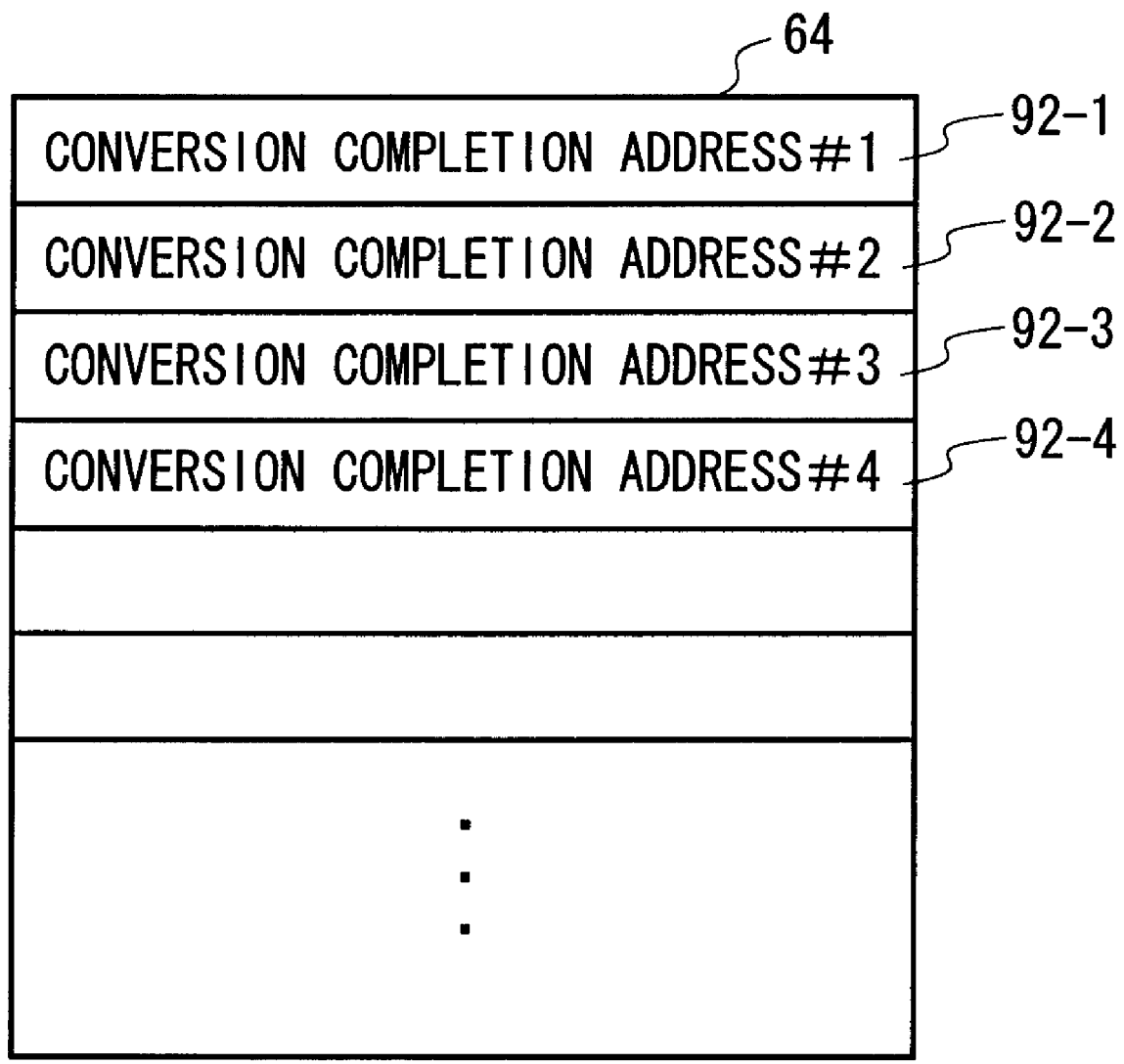
FIG. 11 shows another example of conversion completion information stored in the conversion completion information memory 64 according to the present embodiment.

FIG. 11 shows another example of conversion completion information stored in the conversion completion information memory 64 according to the present embodiment. The conversion completion information memory 64 may store one or more address storage regions 92-1, 92-2, etc. The address storage region 92 indicates the leading address of each piece of waveform data whose corresponding conversion completion data is already written to the waveform memory 30.

During the filtering process, the filtering section 38 determines whether the conversion is completed for each piece of waveform data designated for generation by the list. The filtering section 38 determines the conversion to be completed if the corresponding address storage region 92 is stored in the conversion completion information memory 64, and determines the conversion to not yet be completed if the corresponding address storage region 92 is not stored in the conversion completion information memory 64. In this way, the filtering section 38 of the present example can easily perform the conversion completion determination.

Figure 12:
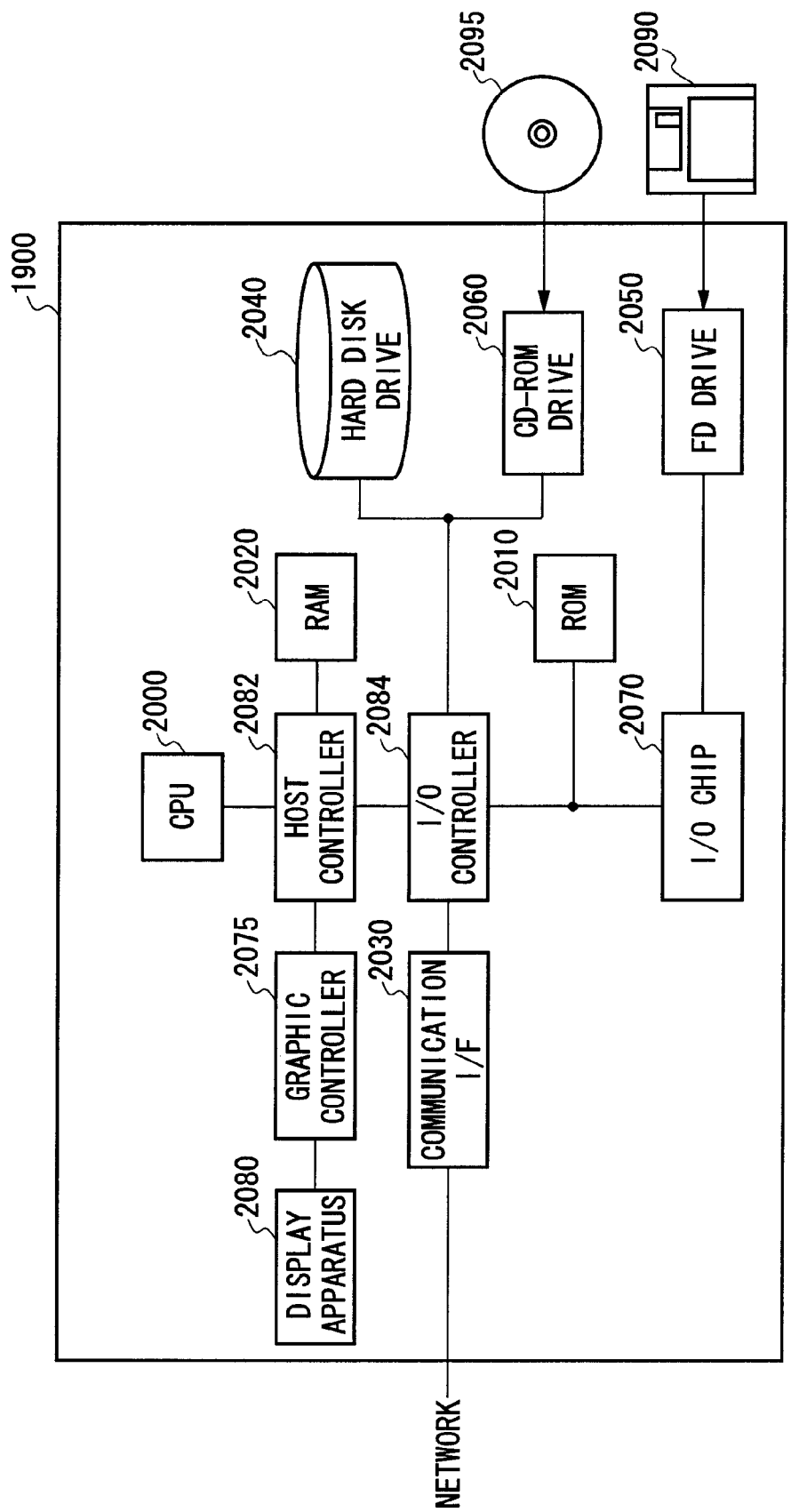
FIG. 12 shows an example of a hardware configuration of a computer 1900 according to the present embodiment.

FIG. 12 shows an example of a hardware configuration of a computer 1900 according to the present embodiment. The computer 1900 according to the present embodiment is provided with a CPU peripheral including a CPU 2000, a RAM 2020, a graphic controller 2075, and a displaying apparatus 2080, all of which are connected to each other by a host controller 2082; an input/output section including a communication interface 2030, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the displaying apparatus 2080. Instead, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively low speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

The programs installed in the computer 1900 to make the computer 1900 function as the waveform generating apparatus 16 are provided with a waveform module, a list module, a setting module, a waveform output module, and a filtering process module. These programs and modules prompt the CPU 2000 or the like to make the computer 1900 function as the waveform memory 30, the list memory 32, the setting section 34, the waveform output section 36, and the filtering section 38, respectively.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A waveform generating apparatus that generates a signal having an arbitrary waveform to test a device under test, the waveform generating apparatus comprising:
   a waveform memory that stores a plurality of pieces of waveform data that each include a sequence of signal values;
   a filtering section that (i) reads from the waveform memory a piece of waveform data serving as a basis for a waveform to be generated, from among the plurality of pieces of waveform data, (ii) performs a conversion by filtering the read piece of waveform data, using a filter coefficient that represents the inverse of a frequency characteristic of a transmission path from the waveform generating apparatus to the device under test on which the signal is transmitted, to obtain a piece of converted waveform data, and (iii) writes to the waveform memory the piece of converted waveform data; and
   a waveform output section that reads the piece of converted waveform data from the waveform memory and outputs a signal having a waveform corresponding to the sequence of signal values of the read piece of converted waveform data.

2. The waveform generating apparatus according to claim 1, further comprising a list memory that stores a list designating an order of generation for two or more waveforms, wherein the filtering section, upon receiving an instruction for waveform generation, reads from the waveform memory a piece of waveform data serving as a basis for a waveform designated by the list, converts the read piece of waveform data into a piece of converted waveform data, and writes the piece of converted waveform data to the waveform memory, and the waveform output section reads from the waveform memory, in an order designated by the list, the pieces of converted waveform data corresponding to the waveforms designated by the list, and outputs a signal having a waveform corresponding to the sequences of signal values of the read pieces of converted waveform data.

3. The waveform generating apparatus according to claim 2, wherein when the list designates that one waveform is to be generated multiple times, the filtering section stops performing the conversion if the piece of converted waveform data corresponding to the one waveform is already stored in the waveform memory.

4. The waveform generating apparatus according to claim 3, wherein when processing content changes, the filtering section clears the converted waveform data stored in the waveform memory.

5. The waveform generating apparatus according to claim 3, further comprising a conversion completion information memory that stores, for each piece of waveform data that can serve as a basis for a waveform to be generated, conversion completion information that indicates whether conversion of the piece of waveform data is completed, wherein the filtering section (i) sequentially determines, for each piece of waveform data serving as a basis for a waveform designated by the list, whether the conversion completion information indicates that the conversion is incomplete, (ii) performs the conversion for each piece of waveform data whose conversion is determined to be incomplete, and (iii) changes the conversion completion information for each piece of waveform data on which the conversion is performed to indicate that the conversion is completed.

6. The waveform generating apparatus according to claim 2, wherein when a waveform in a portion of the list is designated to be output, the filtering section converts the piece of waveform data corresponding to the waveform designated in the portion of the list into a piece of converted waveform data and writes the piece of converted waveform data to the waveform memory, and the waveform output section reads from the waveform memory, in an order designated by the portion of the list, the piece of converted waveform data corresponding to the waveform designated by the portion of the list, and outputs a signal having a waveform corresponding to the sequence of signal values of the read piece of converted waveform data.

7. The waveform generating apparatus according to claim 1, wherein the waveform memory stores, as a piece of waveform data serving as a basis for a waveform to be generated, a piece of user waveform data representing a waveform designated by a user and at least one piece of rate conversion waveform data obtained by performing a rate conversion on the piece of user waveform data, and the filtering section selects the piece of waveform data corresponding to a set rate, and converts the selected piece of waveform data into a piece of converted waveform data.

8. A waveform generating method for generating a signal having an arbitrary waveform to test a device under test, the waveform generating method comprising:

storing in a waveform memory a plurality of pieces of waveform data that each include a sequence of signal values;

(i) reading from the waveform memory a piece of waveform data serving as a basis for a waveform to be generated, from among the plurality of pieces of waveform data, (ii) performing a conversion by filtering the read piece of waveform data, using a filter coefficient that represents the inverse of a frequency characteristic of a transmission path to the device under test on which the signal is transmitted, to obtain a piece of converted waveform data, and (iii) writing to the waveform memory the piece of converted waveform data; and reading the piece of converted waveform data from the waveform memory and outputting a signal having a waveform corresponding to the sequence of signal values of the read piece of converted waveform data.

9. A non-transitory computer readable medium storing thereon a program for causing an information processing apparatus to function as a waveform generating apparatus that generates a signal having an arbitrary waveform to test a device under test, the program causing the information processing apparatus to function as a waveform generating apparatus comprising:

a waveform memory that stores a plurality of pieces of waveform data that each include a sequence of signal values;

a filtering section that (i) reads from the waveform memory a piece of waveform data serving as a basis for a waveform to be generated, from among the plurality of pieces of waveform data, (ii) performs a conversion by filtering the read piece of waveform data, using a filter coefficient that represents the inverse of a frequency characteristic of a transmission path from the waveform generating apparatus to the device under test on which the signal is transmitted, to obtain a piece of converted waveform data, and (iii) writing to the waveform memory the piece of converted waveform data; and a waveform output section that reads the piece of converted waveform data from the waveform memory and outputs a signal having a waveform corresponding to a sequence of signal values of the read piece of converted waveform data.

* * * * *